United States Patent
Inoue et al.

(10) Patent No.: US 7,221,016 B2
(45) Date of Patent: May 22, 2007

(54) SEMICONDUCTOR DEVICE WITH MEMORY FUNCTION AND METHOD OF MANUFACTURE

(75) Inventors: Satoshi Inoue, Suwa (JP); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/841,544

(22) Filed: May 10, 2004

(65) Prior Publication Data

US 2004/0206957 A1    Oct. 21, 2004

Related U.S. Application Data

(62) Division of application No. 09/899,058, filed on Jul. 6, 2001, now Pat. No. 6,787,403.

(30) Foreign Application Priority Data

Jul. 11, 2000    (GB)  ................................ 0017158.7

(51) Int. Cl.
*H01L 29/788*    (2006.01)

(52) U.S. Cl. ........................ 257/315; 257/317
(58) Field of Classification Search ................ 257/414, 257/422, 402, 405, 407, 659, 315–316
See application file for complete search history.

(56) References Cited

U.S. PATENT DOCUMENTS

| | | | |
|---|---|---|---|
| 5,172,204 A | | 12/1992 | Hartstein |
| 5,395,804 A | * | 3/1995 | Ueda ........................... 438/166 |
| 5,852,306 A | * | 12/1998 | Forbes ........................ 257/315 |
| 5,936,291 A | | 8/1999 | Makita et al. |
| 6,208,000 B1 | | 3/2001 | Tanamoto et al. |
| 6,310,376 B1 | * | 10/2001 | Ueda et al. ................. 257/315 |
| 6,635,521 B2 | | 10/2003 | Zhang et al. |

FOREIGN PATENT DOCUMENTS

EP    0 166 208 A2    1/1986

OTHER PUBLICATIONS

Ya-Chin King et al., "MOS Memory Using Germanium Nanocrystals Formed by Thermal Oxidation of $Si_{1-x}Ge_x$,", IEDM, 1998 pp. 115-118.

* cited by examiner

*Primary Examiner*—Theresa T. Doan
(74) *Attorney, Agent, or Firm*—Oliff & Berridge, PLC

(57) ABSTRACT

A TFT memory 11 is provided with a polysilicon layer 22, wherein each region of the source 22a, the channel 22b and the drain 22c are formed on a substrate 21, and gate oxide films (insulating films) 23 and 25 are formed on the polysilicon layer 22; and a plurality of silicon particles 24 for trapping the charge of injected carriers are placed between the gate oxide films 23 and 25. Specifically, the gate oxide films comprise a first gate oxide film 23 and a second gate oxide film 25 formed on the first gate oxide film 23; the plurality of silicon particles 24 are located between the first gate oxide film 23 and the second gate oxide film 25, and the first gate oxide film 23 is formed in an extremely thin thickness.

26 Claims, 7 Drawing Sheets

SEMICONDUCTOR DEVICE WITH MEMORY FUNCTION AND METHOD OF MANUFACTURE

This is a Divisional of application Ser. No. 09/899,058 filed Jul. 6, 2001, now U.S. Pat. No. 6,787,403. The entire disclosure of the prior application is hereby incorporated by reference herein in its entirety.

BACKGROUND OF THE INVENTION

1. Field of the Invention

The present invention relates to a semiconductor device and the method of manufacture and, particularly, relates to a semiconductor device having memory functions.

2. Description of Related Art

As one type of nonvolatile memory, a floating gate nonvolatile memory is conventionally known. This memory demonstrates nonvolatile memory functions by injecting carriers to a floating gate and holding therein.

With this type of nonvolatile memory, the floating gate EPROM at a p-channel having an MOS structure was first used for practical purposes. For this type of floating gate, polycrystalline silicon doped with a large quantity of impurities is used, and carriers are injected to floating gates (for writing or programming) by causing avalanche breakdown at drain junctions. This type of nonvolatile memory is called FAMOS (Floating-gate Avalanche-injection MOS). The information written in FAMOS can be erased by the irradiation of ultraviolet rays and X-rays at a sufficiently high energy level.

Nonvolatile memory, having a structure wherein a control gate made of polycrystalline silicon is laminated on the FAMOS floating gate, is called SAMOS (Stacked-gate Avalanche-injection MOS) memory. An appropriate level of voltage is applied to the control gate during the injection process of carriers for avalanche breakdown, so that an electric field near a drain is intensified and avalanche breakdown is likely to occur. At the same time, the electrons generated by the avalanche breakdown may be more effectively attracted to the side of a floating gate, thereby shortening the writing time. Additionally, the control gate may be used like the gate electrodes of normal MOS transistors during the process of information readout.

Devices having an SAMOS structure at an n-channel have been recently referred to as FAMOS, and have become the standard EPROM structure. In this case, channel hot electrons are injected into a floating gate.

Furthermore, according to other research, MOS memory has been proposed as in the thesis, "MOS Memory Using Germanium Nanocrystals Formed by Thermal Oxidation of Si1-xGex, Ya-Chin King et al., IEDM 98 115-118." This is a memory element in which a charge trapping bodies comprising germanium fine particles are buried in an MOSFET gate insulating body. On the other hand, since economical glass substrates, instead of expensive quartz substrates, may be used and preferable TFT characteristics may be easily obtained, the polysilicon TFT formed in the process of a relatively low temperature (about 600° C. or below) has been focused upon.

However, although this TFT is used for the picture elements of displays and peripheral circuits, it is not a device that could be used as a memory element like the above-noted MOS memory. Therefore, a memory and a display cannot be mounted on one panel in one body in, for example, an active matrix display in which a TFT is used for a picture element unit. This is one of the obstacles to the further miniaturization and electricity reduction of liquid crystal display devices or the like.

BRIEF SUMMARY OF THE INVENTION

It is an object of the present invention to provide memory functions to a semiconductor device and to broaden the application of semiconductor devices.

In order to achieve the above objective, a semiconductor device according to the present invention has a substrate, a semiconductor layer, in which each source, channel and drain region is formed on the substrate, and an insulating film is formed on the semiconductor layer, and granular electron trapping bodies are placed inside the insulating film to trap the electrons of injected carriers.

Preferably, the electron trapping bodies are a plurality of semiconductor or metal granules. For instance, the plurality of granules is made up of silicon particles. It is preferable that these silicon particles have a diameter of 1 μm or less, 1000 angstroms or less, or 500 angstroms or less.

Moreover, it is preferable that the insulating film comprise a first insulating film formed on the semiconductor layer and a second insulating film formed on the first insulating film, with the plurality of granules being placed between the first insulating film and the second insulating film. In this case, the first insulating film is preferably formed at an extremely thin thickness. Preferably, the first insulating film is formed so as to have a film thickness of 500 angstroms or less, 100 angstroms or less, or 50 angstroms or less.

More preferably, in the above-mentioned structure, a control gate for electrical field application is formed on the insulating film so as to face the channel region.

It is further preferable that the transistor, formed of the substrate and the semiconductor layer mentioned above, be a thin-film transistor (TFT). For example, the semiconductor layer is formed in a low-temperature polysilicon process, and the thin-film transistor is formed as low-temperature polysilicon TFT.

On the other hand, the manufacture of a semiconductor device according to the present invention includes a first step of forming a semiconductor layer, which has each source, channel and drain region on a substrate; and a second step of forming an insulating body, which has granular charge trapping bodies inside, to trap the charge of injected carriers.

In this case, it is preferable that the second step also have the steps of forming a first insulating film, constituting a portion of the above-mentioned insulating film, on the semiconductor layer; placing the granular charge trapping bodies on the first insulating film; and forming a second insulating film, constituting the remaining portion of the insulating film mentioned above, on the first insulating film with the charge trapping bodies being kept on the first insulating film.

Preferably, the first insulating film is formed by plasma oxidation. Additionally, as another preferred example, charge trapping bodies are formed by sputtering and etching. In this case, it is preferable that Al—Si be sputtered and that only Al be etched thereafter. Moreover, according to another preferred example, the second insulating film is formed by the CVD method. Besides these methods, it is also possible to form the first insulating film by plasma oxidation, the charge trapping bodies by sputtering and etching, and the second insulating film by the CVD method.

Furthermore, the granular charge trapping bodies are, for instance, silicon particles.

Moreover, the first step is a step where the semiconductor layer is formed in a low-temperature polysilicon process. A low-temperature polysilicon TFT (thin-film transistor) may be formed in this step.

As explained above, the present invention has a semiconductor layer, which has each source, channel and drain region formed on a substrate, an insulating film formed on the semiconductor layer, and granular charge trapping bodies (for instance, a plurality of semiconductor or metal particles) inside the insulating film to trap the charge of injected carriers, so that TFT memory may be provided by adding memory functions with granular charge trapping bodies to a thin-film transistor (TFT) element comprising a substrate and a conductive layer.

As a result, the applications of TFT elements are broadened to memory elements. Conventionally, TFT elements are only applied to the picture elements of displays and the peripheral circuits. As the TFT memory is used as a memory unit, the unit may be mounted on the same panel as that of other thin-film structural bodies using TFTs (for instance, a liquid crystal display and the driver circuit thereof), thus significantly miniaturizing, compacting or making an energy-saving device and system.

BRIEF DESCRIPTION OF THE SEVERAL VIEWS OF THE DRAWINGS

The present invention will now be described by way of further example only and with reference to the accompanying drawings in which:—

DETAILED DESCRIPTION OF THE INVENTION

The preferred embodiment of the present invention is explained hereafter, with reference to the drawings.

Figure 1:
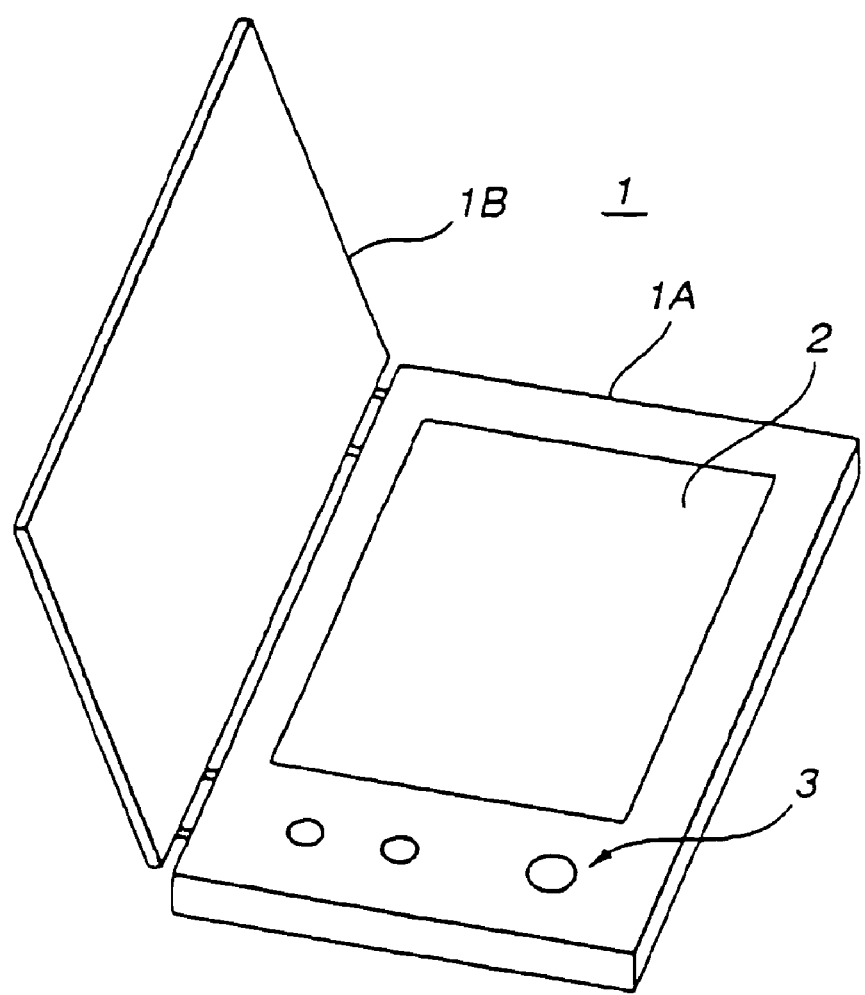
FIG. 1 shows an example of an electronic book using a liquid crystal display device with a built-in thin-film semiconductor device having memory functions in accordance with the present invention.

The liquid crystal display device 1 according to the embodiment constitutes the electronic book shown in FIG. 1. This liquid crystal display device 1 has a book-form frame 1A and an opening and a closing cover 1B in the frame 1A. In frame 1A, a liquid crystal display unit 2 is arranged so as to expose a display surface at the surface, and a control unit 3 is also arranged.

Figure 2:
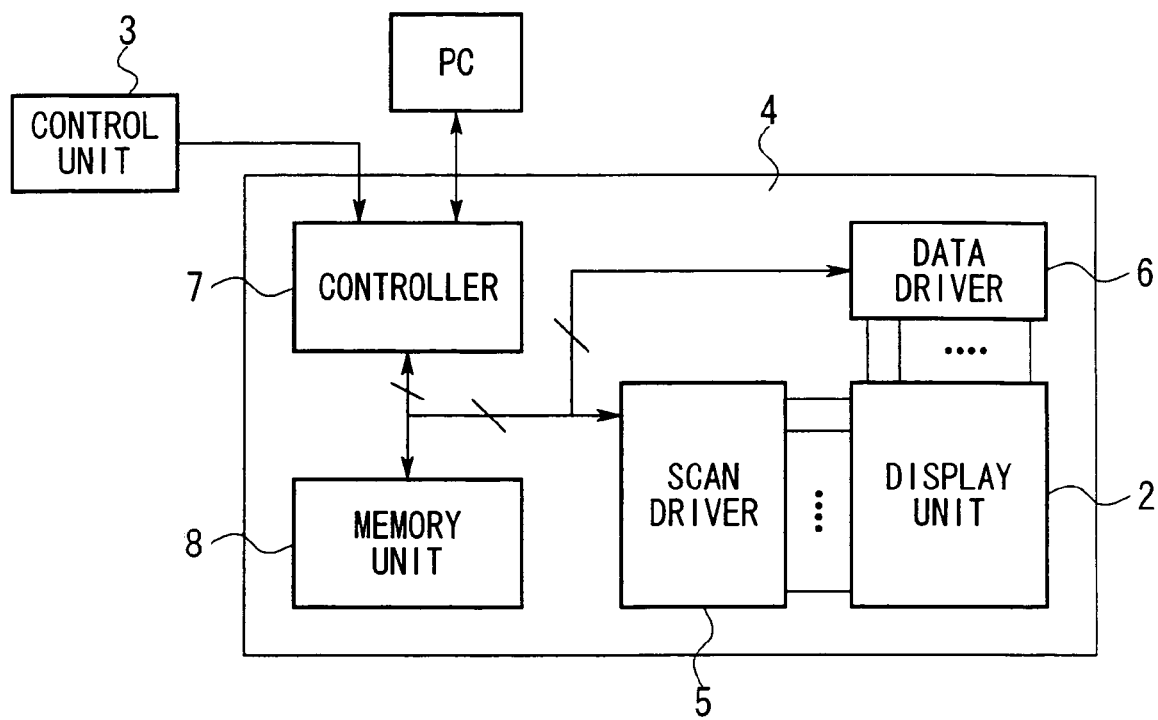
FIG. 2 shows the electric block structure of the liquid crystal display device.

As shown in FIG. 2, a panel 4 is arranged inside the frame 1A. On this panel, a picture element unit is provided as the above-described liquid crystal display unit 2, and a scan driver 5 and a data driver 6 are provided to control the display of the picture element unit for each picture element. Also provided is a controller 7 for controlling displays through both drivers 5 and 6, and a memory unit 8 where display information is stored in advance. The controller 7 and the memory unit 8 are conventionally mounted on a separate panel from that of the display unit 2 and the drivers 5 and 6, but the controller 7 and the memory unit 8 are mounted on one panel 4 in the embodiments. The display body having this structure is generally known as a System on Panel.

Such a device may be provided by the application of a polysilicon TFT (thin-film transistor). A low-temperature process for manufacturing the TFT is advantageous because a TFT can be formed on a low-thermal resistant substrate such as a glass substrate. Specifically, to each memory element of the memory unit 8, a memory element using the low-temperature polysilicon TFT of the present invention as a thin-film semiconductor device (mentioned as TFT memory hereinafter) is adopted, instead of a conventional floating gate MOS or the like. Further, the TFT memory elements may be used directly in the display unit 2.

This TFT memory is explained below.

Figure 3:
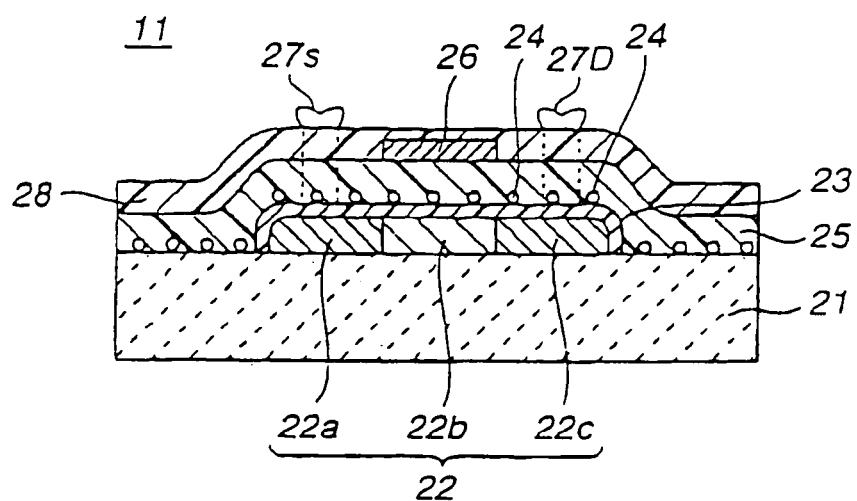
FIG. 3 is a partial cross-sectional view, showing the thin-film structure of a TFT memory as a semiconductor thin-film device.
Figure 4:
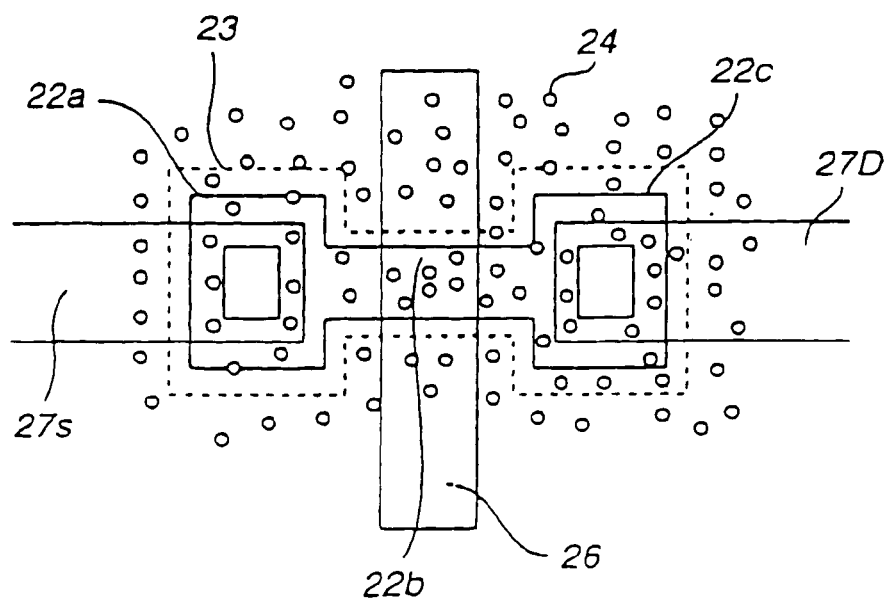
FIG. 4 is a plane view of the TFT memory in FIG. 3.

FIG. 3 shows a cross section of one element of a TFT memory 11 as a thin-film semiconductor device; and FIG. 4 shows the positional relations of electrodes when the TFT memory 11 is seen from the top.

The TFT memory 11, as shown in FIG. 3, has a glass substrate 21, and a source 22a, wherein a channel layer 22b and a drain 22c made of a polysilicon layer 22 are formed on one part of the substrate 21. An extremely thin first gate oxide film 23 is formed over the entire polysilicon layer 22. The film thickness thereof is, for example, about 50 angstroms. As other thicknesses, the first gate oxide film 23 may be 50 angstroms or thinner, 100 angstroms or thinner, or 500 angstroms or thinner; and preferably, the film is formed to be extremely thin.

On the first gate oxide film 23, silicon particles 24 for charge storage are deposited. Regarding the silicon particles 24, for instance, the particle diameter is about 100 angstroms and the density per unit area is about 20%. These particles may be composed of other materials, such as semiconductor particles or metal particles. As for additional particle diameters, it is preferable to form the silicon particles 24 at a particle diameter of 1 μm or below, 1000 angstroms or below, or 500 angstroms or below.

A second gate oxide film 25 is formed while the silicon particles 24 are maintained on the first gate oxide film 23. The film thickness is about 1000 angstroms. A control gate 26 is formed on the second gate oxide film 25, at the location corresponding to the channel layer 22b. The electrode is made of polysilicon, or a metal such as aluminum or tantalum. Furthermore, a layer-to-layer insulating film 28 is formed over the entire element of the TFT memory 11. Additionally, as shown in FIG. 4, a source electrode 27S and a drain electrode 27D are formed through contact holes at appropriate locations from the source 22a and the drain 22c.

The method of manufacturing this TFT memory 11 is explained hereafter, based on FIGS. 5A to 5D.

Figure 5A:
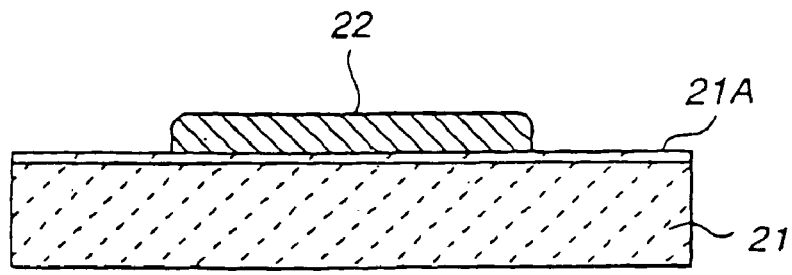
FIG. 5A to FIG. 5D show the steps of manufacturing the TFT memory.

First, as shown in FIG. 5A, for example, a base film 21A made of $SiO_2$ is formed on the top of the glass substrate 21; an amorphous silicon film is accumulated thereon; and e.g., an excimer laser is used to irradiate the amorphous silicon film, and crystallizes the film by locally heating and melting the film, thereby forming a polysilicon layer 22 patterned in a predetermined shape.

Figure 5B:
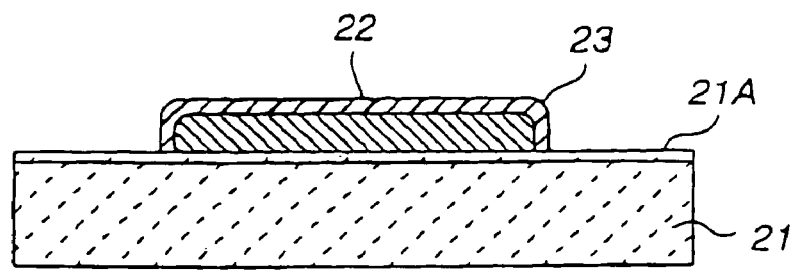

Subsequently, as shown in FIG. 5B, a first gate oxide film 23 is formed by plasma oxidation. The conditions of plasma oxidation are established so as to provide an extremely thin first gate oxide film 23.

Figure 5C:
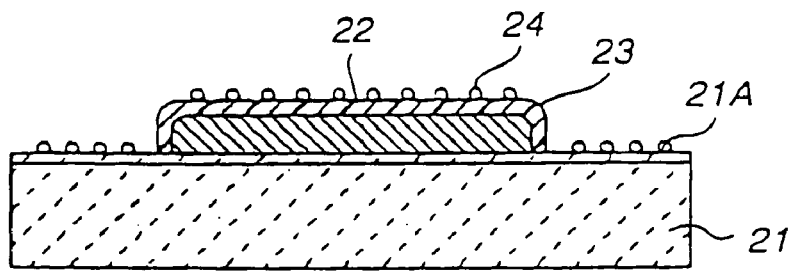

Then, aluminum-silicon (Al—Si) is sputtered, and the aluminum is removed by wet etching. As a result, as shown in FIG. 5C, a plurality of silicon (Si) particles 24 remains on the first gate oxide film 23. The silicon particles 24 may be left only above the channel layer 22b.

Figure 5D:
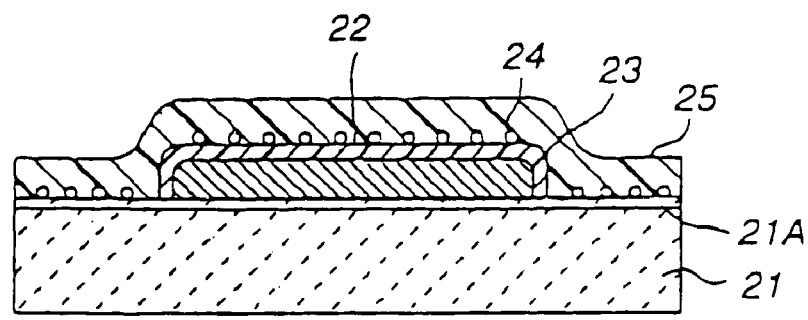

With the silicon particles 24, SiO2 (silicon dioxide) is accumulated by the CVD method on the first gate oxide film 23, as shown in FIG. 5D, thereby forming a second gate oxide film 25. Accordingly, a second gate oxide film 25 is coated with the silicon particles 23 dispersed in an appropriate density on the first gate oxide film, burying the silicon particles 24 in the insulating body.

Furthermore, though not shown in FIG. 5A to FIG. 5D, a control gate 26 is formed by a conventional method (see FIG. 3). Subsequently, by the conventional method where ions are injected by using the control gate and a mask layer as masks, a source 22a and a drain 22c are formed in the polysilicon layer 22. Thus, the polysilicon layer 22 becomes the source 22a, the channel layer 22b and the drain 22c. Subsequently, a layer-to-layer insulating film 28 is formed over the entire TFT memory 11; and after the contact holes are formed, a source electrode 27S and a drain electrode 27D are formed (see FIG. 3).

In the manufactured TFT 11, the silicon particles 24 are completely covered with oxide films 23 and 25, so that the charge injected into these silicon particles 24 cannot easily escape, since the energy barrier between the silicon particles 24 and the oxide films 23 and 25 is substantial. In this state, information is written into the TFT memory 11.

Figure 7A:
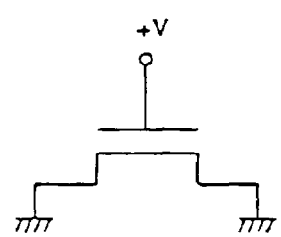
FIG. 7A illustrates the application of a positive voltage to the control gate so as to write information and FIG. 7B illustrates the application of a positive voltage to the drain so as to erase information.

When information is written into the TFT memory 11, an appropriate positive voltage is applied to the control gate 26, as shown in FIG. 7A, and electrons are injected into the silicon particles 24 from the channel side by "Fowler-Nordheim" tunneling. As the first gate oxide film 23 is formed of an extremely thin thickness, the injection of charge will be easy.

Figure 6:
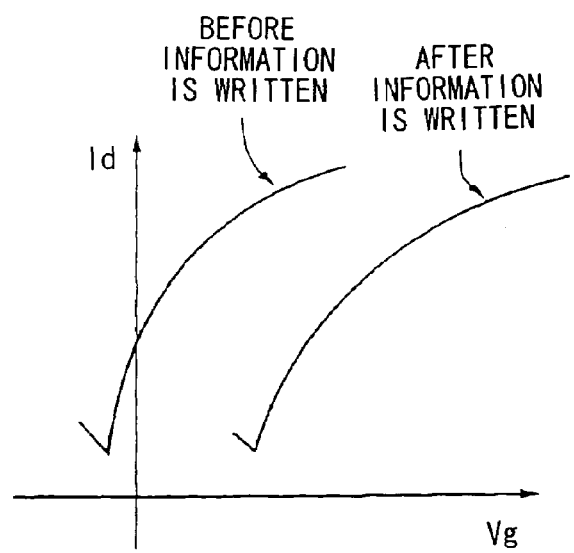
FIG. 6 is a figure, showing qualitative changes in the characteristics of the control gate voltage Vg and the drain current Id of the TFT memory in respect to information writing.

Therefore, the characteristics of the "control gate voltage Vg—drain current Id" of the TFT 11 qualitatively change, as shown in FIG. 6, in response to information writing. In the state before the information is written, electrons are not yet injected, and the threshold voltage is low. As electrons are injected by information writing, its charge is trapped and the threshold voltage increases, holding the information (charge).

Figure 7B:
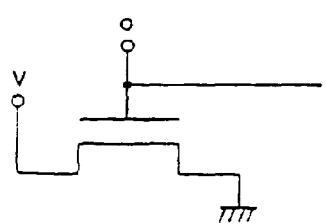

Additionally, when the information in the TFT memory 11 is erased, an appropriate positive voltage may be applied to the drain 22C, which is opposite to the writing process shown in FIG. 7B. However, in actually constructing a memory array, the transistors that form a switch for each memory cell are generally connected in series in order to provide selectivity.

As a memory element is formed by the application of the low-temperature polysilicon TFT, a System on Panel, such as that shown in FIG. 2 can be provided. Accordingly, the structure and the scale of a device or a system as a whole becomes compact, and maintenance and the like becomes easy. Additionally, as TFT memory, use may be made of the memory of an IC card and the like, broadening the range of applications.

Moreover, the charge trapping bodies buried in the gate oxide film (gate insulating film) of the TFT memory 11 are in granular form, so that there is no danger of a short-circuit between a source and a drain.

Furthermore, as the TFT memory 11 is formed of a low-temperature polysilicon TFT, economical glass substrates may be used.

Additionally, the present invention is not limited to the above-noted embodiments and may also be modified in various forms.

The description given above relates to an apparatus using an LCD. It will be readily apparent, however, that other types of display may equally well be used—for example, organic or inorganic electroluminescent displays, pr electrophoretic displays.

The semiconductor device of the present invention may be used in display devices incorporated in many types of equipment such as mobile displays e.g. mobile phones, laptop personal computers, DVD players, cameras, field equipment; portable displays such as desktop computers, CCTV or photo albums; or industrial displays such as control room equipment displays.

Several electronic apparatuses using the semiconductor device of the present invention will now be described.

<1: Mobile Computer>

An example in which the semiconductor device according to one of the above embodiments is applied to a mobile personal computer will now be described.

Figure 8:
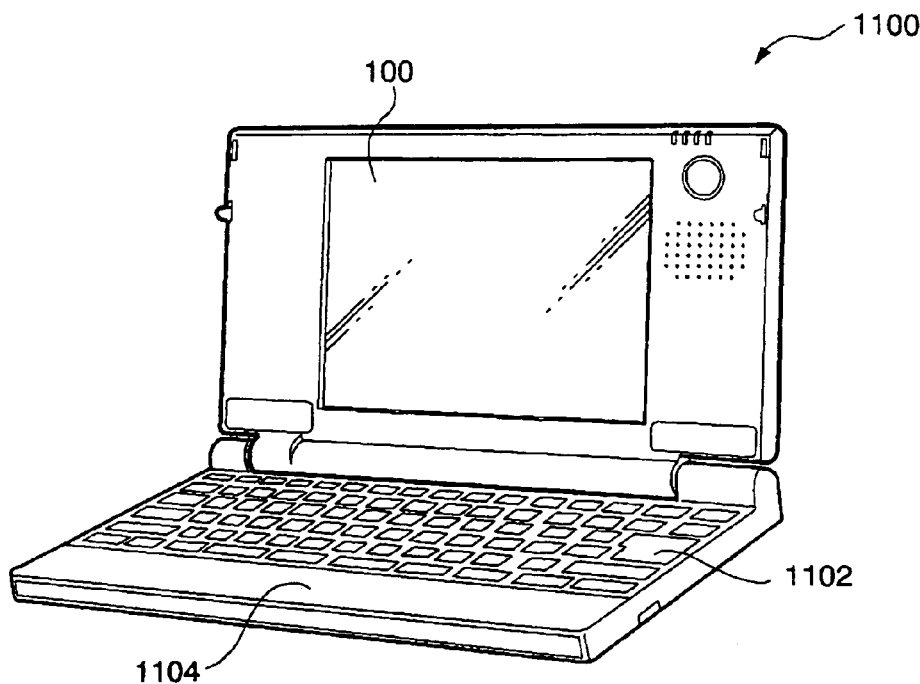
FIG. 8 is a schematic view of a mobile personal computer incorporating a display device having a pixel driver according to the present invention.

FIG. 8 is an isometric view illustrating the configuration of this personal computer. In the drawing, the personal computer 1100 is provided with a body 1104 including a keyboard 1102 and a display unit 1106. The display unit 1106 is implemented using a display panel incorporating semiconductor devices according to the present invention, as described above.

<2: Portable Phone>

Figure 9:
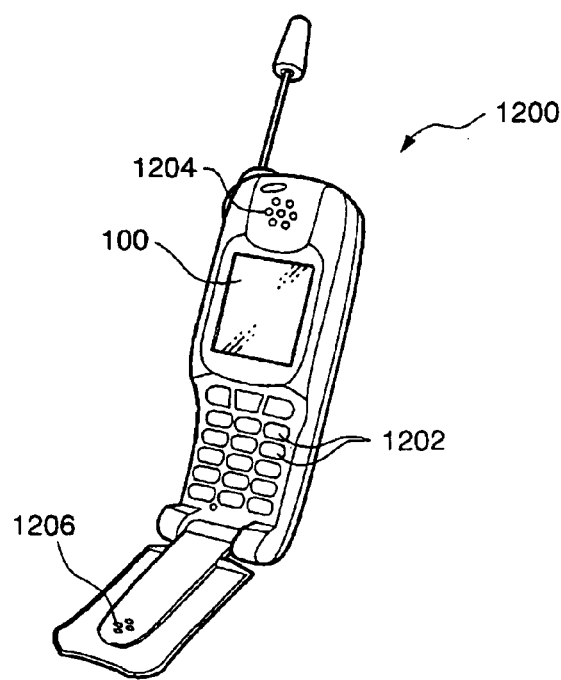
FIG. 9 is a schematic view of a mobile telephone incorporating a display device having a pixel driver according to the present invention.

Next, an example in which the semiconductor device is applied to a display section of a portable phone will be described. FIG. 9 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using semiconductor devices fabricated according to the present invention, as described above.

<3: Digital Still Camera>

Figure 10:
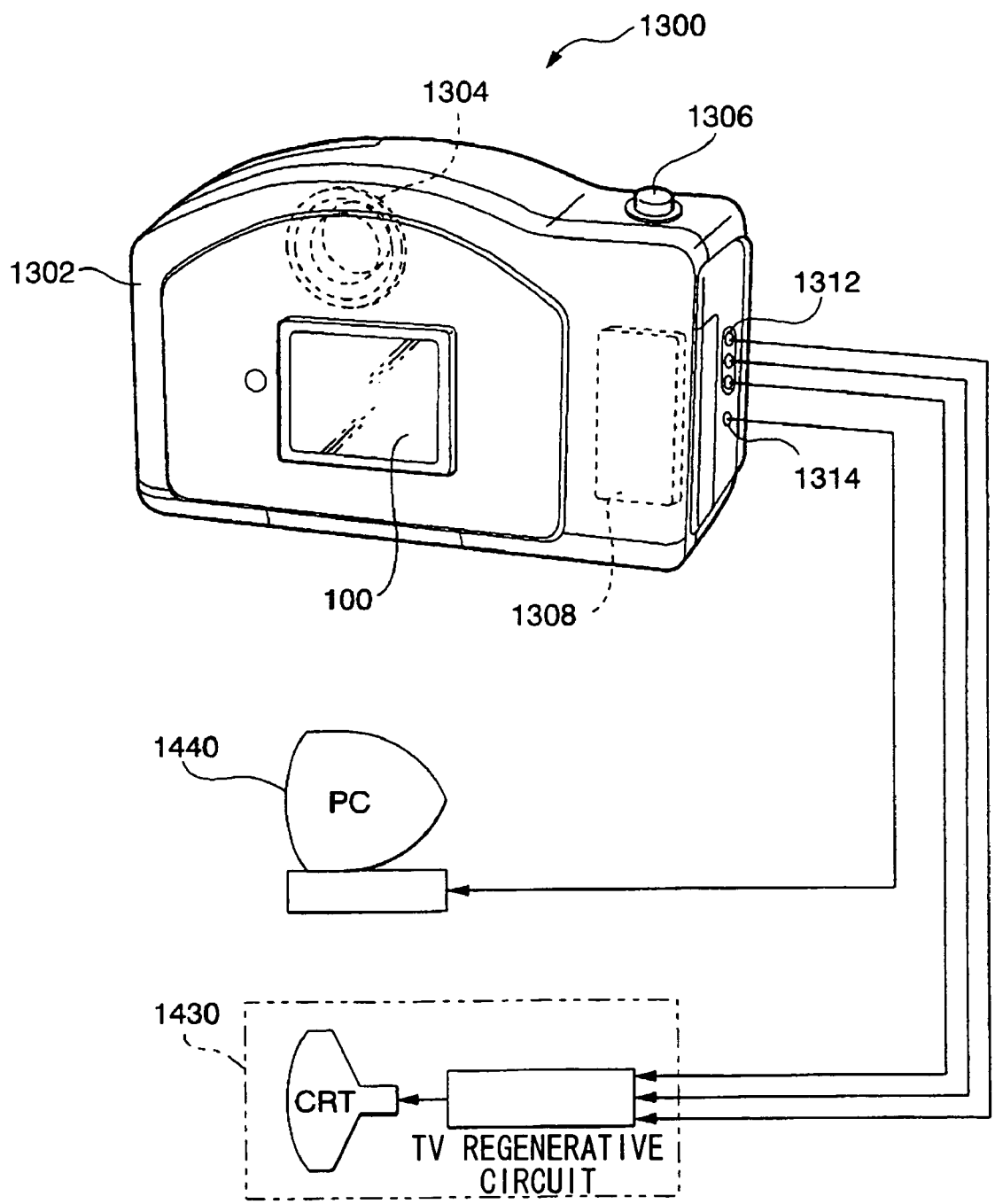
FIG. 10 is a schematic view of a digital camera incorporating a display device having a pixel driver according to the present invention.

Next, a digital still camera using an OELD display device as a finder will be described. FIG. 10 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OELD 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OELD panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 8, the portable phone shown in FIG. 9, and the digital still camera shown in FIG. 10, include OELD television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, semiconductor devices according to the present invention can be applied to the display sections of these electronic apparatuses.

What is claimed is:

1. A semiconductor device comprising:
    a substrate;
    a base film that is formed on the substrate;
    a semiconductor layer that includes a source region, a channel region and a drain region that are formed on the base film;
    an insulating film that is formed on the semiconductor layer; and
    granular charge trapping bodies that are formed above at least one of the channel region, the source region, and the drain region and that are disposed two-dimensionally, the granular charge trapping bodies being formed in the insulating film, the granular charge trapping bodies trapping at least a portion of injected carriers, wherein
    the granular charge trapping bodies contact the base film.

2. The semiconductor device according to claim 1, the granular charge trapping bodies being disposed in the insulating film.

3. The semiconductor device according to claim 1, the base film being made of $SiO_2$.

4. A semiconductor device, comprising:
    a substrate;
    a base film that is formed on the substrate;
    a semiconductor layer that includes a source region, a channel region, and a drain region that are formed on the base film;
    an insulating film having a first part which contacts the semiconductor layer and a second part which contacts the base film; and
    a plurality of particles that are disposed in the first part and the second part,
    the plurality of particles being formed of a semiconductor or metal, and
    the plurality of particles being formed in the insulating film, wherein
    the plurality of particles contact the base film.

5. The semiconductor device according to claim 4, the substrate being an insulating substrate.

6. The semiconductor device according to claim 4, the plurality of particles being silicon particles.

7. The semiconductor device according to claim 6, the silicon particles having a particle diameter of 1 µm or less.

8. The semiconductor device according to claim 6, the silicon particles having a particle diameter of 1000 angstroms or less.

9. The semiconductor device according to claim 6, the silicon particles having a particle diameter of 500 angstroms or less.

10. The semiconductor device according to claim 4, the insulating film including a first insulating film formed on the semiconductor layer and a second insulating film formed on the first insulating film, the plurality of particles being located between the first insulating film and the second insulating film.

11. The semiconductor device according to claim 10, the first insulating film being formed so as to have a film thickness of 500 angstroms or less.

12. The semiconductor device according to claim 10, the first insulating film being formed so as to have a film thickness of 100 angstroms or less.

13. The semiconductor device according to claim 10, the first insulating film being formed so as to have a film thickness of 50 angstroms or less.

14. The semiconductor device according to claim 4, a control gate for electrical field application being formed on the insulating film facing the channel region.

15. The semiconductor device according to claim 4, the substrate and the semiconductor layer constituting a thin-film transistor (TFT).

16. The semiconductor device according to claim 14, the semiconductor layer being formed in a low-temperature polysilicon process, and the thin-film transistor being formed as a low-temperature polysilicon TFT.

17. The semiconductor device according to claim 4, the plurality of particles being formed above the channel region.

18. The semiconductor device according to claim 4, the plurality of particles being formed above the channel region, the source region and the drain region.

19. The semiconductor device according to claim 4, the plurality of particles trapping at least a portion of injected particles.

20. The semiconductor device according to claim 4, the plurality of particles being disposed two-dimensionally.

21. The semiconductor device according to claim 4, the first part functioning as a gate insulating film.

22. The semiconductor device according to claim 4, the base film being made of $SiO_2$.

23. A thin film transistor memory device comprising:
    a substrate;
    a base film that is formed on the substrate;
    a semiconductor layer that includes a source region, a channel region and a drain region that are formed on the base film;
    an insulating film that is formed on the semiconductor layer; and
    granular charge trapping bodies that are formed above at least one of the channel region, the source region, and the drain region and that are disposed two-dimensionally, the granular charge trapping bodies being formed in the insulating film, the granular charge trapping bodies trapping at least a portion of injected carriers, wherein
    the granular charge trapping bodies contact the base film.

24. The thin film transistor memory device according to claim 23, the base film being made of $SiO_2$.

25. A thin film transistor memory device comprising:
    a substrate;

a base film that is formed on the substrate;
a semiconductor layer that includes a source region, a channel region and a drain region that are formed on the base film;
an insulating film having a first part which contacts the semiconductor layer and a second part which contacts the base film; and
a plurality of particles that are disposed in the first part and the second part, the plurality of particles being formed of a semiconductor or metal, and the plurality of particles being formed in the insulating film and contact the base film.

26. The thin film transistor memory device according to claim 25, the base film being made of $SiO_2$.

* * * * *